United States Patent
Cheng et al.

(10) Patent No.: US 12,002,850 B2
(45) Date of Patent: Jun. 4, 2024

(54) NANOSHEET-BASED SEMICONDUCTOR STRUCTURE WITH DIELECTRIC PILLAR

(71) Applicant: International Business Machines Corporation, Armonk, NY (US)

(72) Inventors: Kangguo Cheng, Schenectady, NY (US); Julien Frougier, Albany, NY (US); Ruilong Xie, Niskayuna, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 17/462,526

(22) Filed: Aug. 31, 2021

(65) Prior Publication Data
US 2023/0066597 A1 Mar. 2, 2023

(51) Int. Cl.
*H01L 29/06* (2006.01)
*H01L 21/8234* (2006.01)

(52) U.S. Cl.
CPC .. *H01L 29/0673* (2013.01); *H01L 21/823481* (2013.01); *H01L 29/0649* (2013.01)

(58) Field of Classification Search
CPC ............. H01L 29/0673; H01L 29/0649; H01L 29/66439; H01L 29/775; H01L 21/823481; H01L 21/823807; H01L 21/823878; H01L 27/092; B82Y 10/00
See application file for complete search history.

(56) References Cited

U.S. PATENT DOCUMENTS

| | | | |
|---|---|---|---|
| 9,614,056 B2 | 4/2017 | Xie et al. | |
| 9,871,140 B1 * | 1/2018 | Balakrishnan | B82Y 10/00 |
| 9,997,519 B1 | 6/2018 | Bao et al. | |
| 9,997,598 B2 | 6/2018 | Smith et al. | |
| 10,453,850 B2 | 10/2019 | Smith et al. | |
| 10,510,620 B1 * | 12/2019 | Chanemougame | H01L 27/0924 |
| 10,516,064 B1 * | 12/2019 | Cheng | H01L 29/42392 |
| 10,559,692 B2 | 2/2020 | Reznicek et al. | |
| 10,593,673 B2 | 3/2020 | Miao et al. | |

(Continued)

FOREIGN PATENT DOCUMENTS

| | | |
|---|---|---|
| CN | 109285838 A | 1/2019 |
| CN | 109643715 A | 4/2019 |

(Continued)

OTHER PUBLICATIONS

P. Weckx et al., "Novel Forksheet Device Architecture as Ultimate Logic Scaling Device towards 2nm," 2019 IEEE International Electron Devices Meeting (IEDM), Dec. 7-11, 2019, 4 pages.

(Continued)

*Primary Examiner* — Dao H Nguyen
(74) *Attorney, Agent, or Firm* — Samuel Waldbaum; Ryan, Mason & Lewis, LLP

(57) ABSTRACT

A semiconductor structure includes a substrate, a first device disposed on the substrate and a second device disposed on the substrate. The first device includes a first plurality of nanosheets comprising a p-type material. The second device includes a second plurality of nanosheets comprising an n-type material. A dielectric isolation pillar is disposed between the first device and the second device.

20 Claims, 10 Drawing Sheets

(56) References Cited

U.S. PATENT DOCUMENTS

| | | | |
|---|---|---|---|
| 10,741,641 | B2 | 8/2020 | Guillorn et al. |
| 10,804,165 | B2 | 10/2020 | Seo et al. |
| 2017/0062598 | A1 | 3/2017 | Seo |
| 2018/0151452 | A1* | 5/2018 | Doornbos ........... H01L 29/0673 |
| 2019/0221639 | A1 | 7/2019 | Tseng et al. |
| 2020/0176328 | A1 | 6/2020 | Chang et al. |
| 2020/0294863 | A1* | 9/2020 | Chiang ............. H01L 29/66545 |
| 2020/0294866 | A1 | 9/2020 | Cheng et al. |
| 2021/0074334 | A1 | 3/2021 | Zhu |
| 2021/0134677 | A1* | 5/2021 | Pan .................... H01L 29/0673 |
| 2021/0408009 | A1* | 12/2021 | Zheng ................... H01L 29/775 |
| 2022/0028899 | A1* | 1/2022 | Chen ................. H01L 27/1259 |
| 2023/0062210 | A1* | 3/2023 | Wei ....................... H01L 29/517 |

FOREIGN PATENT DOCUMENTS

| | | |
|---|---|---|
| CN | 109643725 A | 4/2019 |
| CN | 111106111 A | 5/2020 |
| CN | 111584486 A | 8/2020 |
| CN | 110137134 B | 2/2021 |
| WO | 2020248474 A1 | 12/2020 |
| WO | PCT/EP2022/070524 | 11/2022 |

OTHER PUBLICATIONS

P. Weckx et al., "Stacked Nanosheet Fork Architecture for SRAM Design and Device Co-optimization Toward 3nm," IEEE International Electron Devices Meeting (IEDM), Dec. 2-6, 2017, pp. 20.5.1-20.5.4.

* cited by examiner

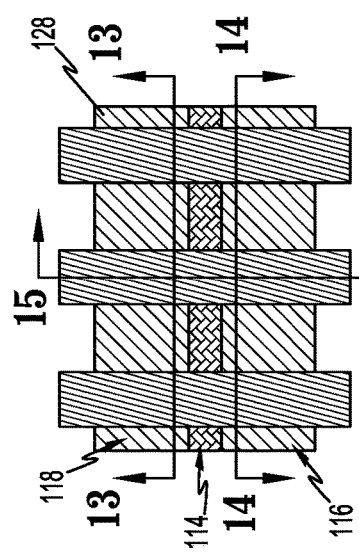
FIG. 12
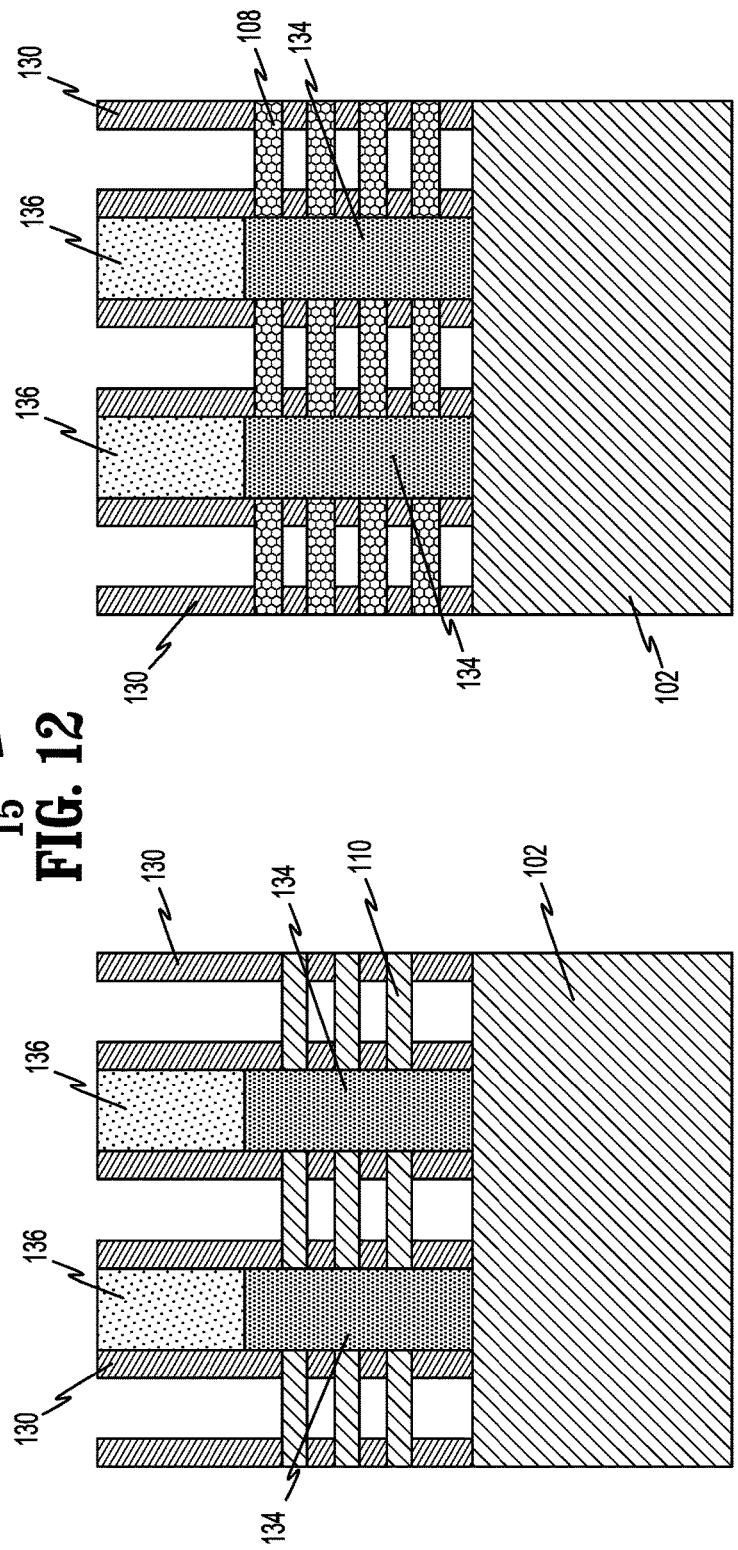
FIG. 13
FIG. 14

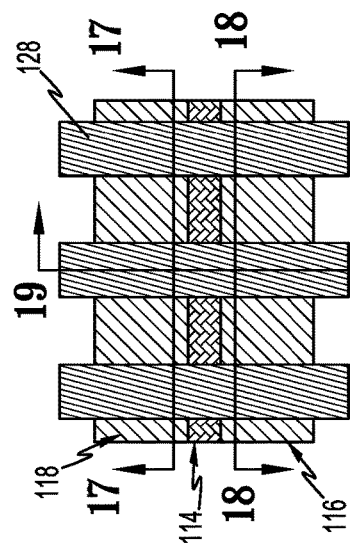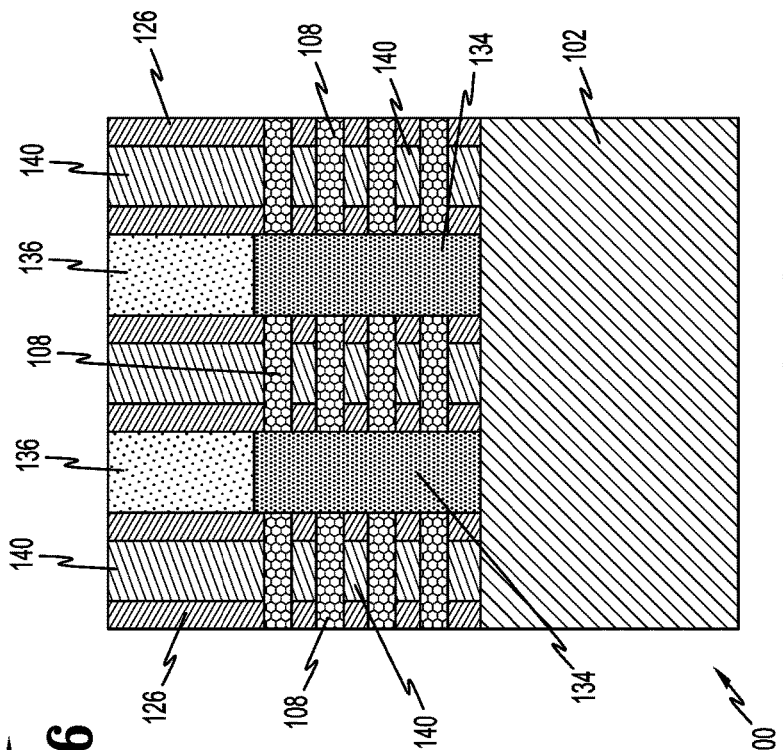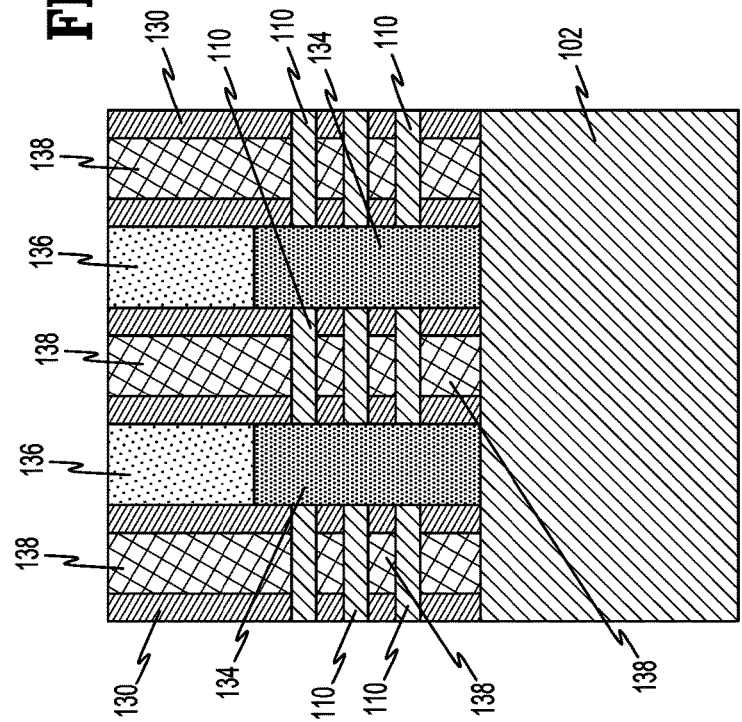

NANOSHEET-BASED SEMICONDUCTOR STRUCTURE WITH DIELECTRIC PILLAR

BACKGROUND

The present application relates to manufacturing of semiconductor integrated circuits, and, more particularly, relates to formation of field effect transistor (FET) devices in integrated circuits. Continued innovations in semiconductor process technologies are enabling higher integration densities and associated device scaling. As the semiconductor industry moves towards even more limitations in spacing architecture, FET devices must be scaled to smaller dimensions to provide an increased effective channel width per footprint area. Such scaling in some cases is achieved using nanosheet FET devices. A given nanosheet FET device comprises a channel which includes multiple nanosheet layers arranged in a stacked configuration, with each nanosheet layer having a vertical thickness that is substantially less than its width. A common gate structure is formed in areas above and below the nanosheet layers in the stacked configuration, thereby increasing the effective channel width of the resulting device, and thus the drive current supported thereby, for a given footprint area. Nanosheet technologies are considered to be a viable option for continued scaling of metal-oxide-semiconductor (MOS) devices, such as complementary MOS (CMOS) devices each comprising an n-type FET region (n-type semiconductor device) and a p-type FET region (p-type semiconductor device).

However, scaling limitations associated with nanosheet device architectures may result in electrostatic issues and mobility degradation. As such, a variation of the nanosheet device architecture, referred to as fork-sheet, has been proposed to address nanosheet scaling issues. In general, a fork-sheet semiconductor device permits tighter spacing between the p-type and n-type semiconductor devices or regions, thereby providing superior area and performance scalability due to the large reduction in the p-type and n-type region separation.

SUMMARY

Illustrative embodiments are directed to fabrication of nanosheet semiconductor structures and devices, particularly forksheet semiconductor structures and devices.

In one illustrative embodiment, a semiconductor structure comprises a substrate, a first device disposed on the substrate and a second device disposed on the substrate. The first device includes a first plurality of nanosheets comprising a p-type material. The second device includes a second plurality of nanosheets comprising an n-type material. A dielectric isolation pillar is disposed between the first device and the second device.

In another illustrative embodiment, a semiconductor structure comprises a substrate, a dielectric isolation pillar extending vertically from the substrate, a pFET device comprising a plurality of channel nanosheets disposed on a first lateral side of the dielectric isolation pillar and in contacting relation therewith and an nFET device comprising a plurality of channel nanosheets disposed on a second lateral side of the dielectric isolation pillar and in contacting relation therewith.

In yet another illustrative embodiment, a method comprises forming a first device on a semiconductor substrate and forming a second device on the semiconductor substrate. The first device includes a first plurality of nanosheets comprising a p-type material. The second device includes a second plurality of nanosheets comprising an n-type material. The method further comprises forming a dielectric isolation pillar extending vertically from the semiconductor substrate between the first device and the second device.

These and other objects, features and advantages of the present disclosure will become apparent from the following detailed description of illustrative embodiments thereof, which is to be read in connection with the accompanying drawings.

BRIEF DESCRIPTION OF THE DRAWINGS

FIG. 12 is a top plan view of the semiconductor structure at a seventh intermediate stage of fabrication.

FIG. 13 is a cross-sectional view of the semiconductor structure at the seventh intermediate stage taken along the lines 13-13 of FIG. 12.

FIG. 14 is a cross-sectional view of the semiconductor structure at the seventh intermediate stage taken along the lines 14-14 of FIG. 12.

FIG. 16 is a top plan view of the semiconductor structure at an eighth intermediate stage of fabrication.

FIG. 17 is a cross-sectional view of the semiconductor structure at the eighth intermediate stage taken along the lines 17-17 of FIG. 16.

FIG. 18 is a cross-sectional view of the semiconductor structure at the eighth intermediate stage taken along the lines 18-18 of FIG. 16.

DETAILED DESCRIPTION

Figure 2:
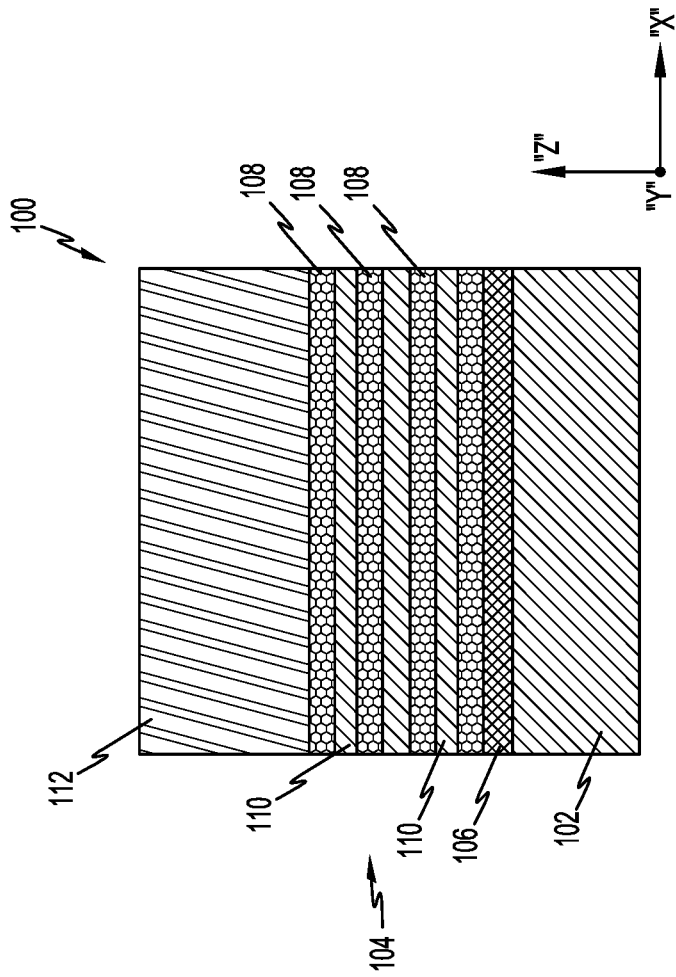
FIG. 2 is a cross-sectional view of the semiconductor structure at the first intermediate stage taken along the lines 2-2 of FIG. 1.

The processes disclosed herein provide an isolation structure in a semiconductor structure such as a nanosheet FET transistor device particularly a fork-sheet CMOS device. The vertical isolation pillar isolates the n-type semiconductor region or device and the p-type semiconductor region or device and extends from within the semiconductor substrate base to the vertical extent of the CMOS device. The n-type semiconductor region and p-type semiconductor region utilize channel nanosheets of different materials which enhances operability of the CMOS device, particularly, performance of the p-type semiconductor regions and facilitates patterning challenges in forming work function metals (WFMs) for the n-type semiconductor region and p-type semiconductor region.

It is understood in advance that although this description includes a detailed description of an illustrative nanosheet FET architecture such as a fork-sheet CMOS device having channel nanosheets in an n-type semiconductor region and a p-type semiconductor region, implementation of the teachings recited herein are not limited to the particular FET architecture described herein. Rather, illustrative embodiments are capable of being implemented in conjunction with any other type of FET device, including, for example, any p-type or n-type nanosheet FET architectures and transistor structures.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto a semiconductor device. Available technologies include physical vapor deposition (PVD), chemical vapor deposition (CVD), electrochemical deposition (ECD), molecular beam epitaxy (MBE) and, more recently, atomic layer deposition (ALD) among others. Removal/etching is any process that removes material from the semiconductor structure. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to an underlying substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the substrate, for example, a wafer, is aligned to the previously formed patterns and slowly the conductors, insulators and selectively doped regions are built up to form the final device.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., film deposition, removal/etching, semiconductor doping, patterning/lithography and annealing steps, are purposefully not described in great detail herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure are not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a nanosheet FET transistor structure or device according to illustrative embodiments utilize a variety of individually known physical and chemical processes performed on a semiconductor (e.g., silicon) substrate, some of which are described in the immediately following paragraphs.

In the discussion that follows, the semiconductor device, which will incorporate nanosheet FET transistor structures, regions or devices, will be referred to as the "semiconductor structure 100" throughout the various stages of fabrication, as represented in all the accompanying drawings. In addition, the following discussion will identify various intermediate stages of fabrication of the semiconductor structure 100. It is to be understood that the intermediate stages are exemplative only. More or less intermediate stages may be implemented in processing the semiconductor structure 100, and the disclosed stages may be in a different order or sequence. In addition, one or more processes may be incorporated within various intermediate stages as described herein, and one or more processes may be implemented in intermediate stages as otherwise described herein.

FIGS. 1-19 illustrate various top plan views and cross-sectional views of at least a portion of the semiconductor structure 100 as it undergoes sequential processing operations as part of the process to form the semiconductor structure.

Figure 1:
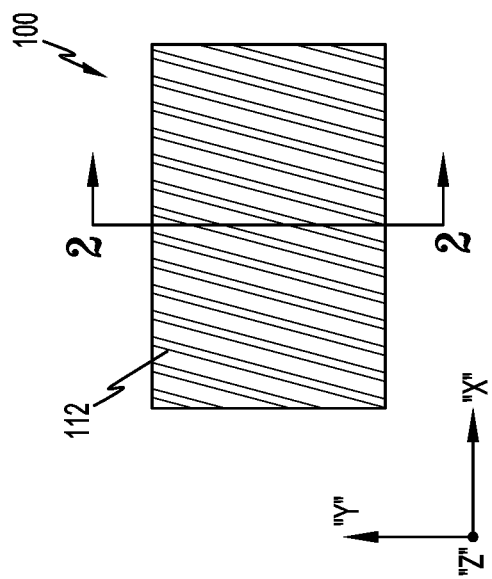
FIG. 1 is a top plan view of the semiconductor structure according to one or more illustrative embodiments at a first intermediate stage of fabrication.

FIG. 1 is top plan view of the semiconductor structure at a first intermediate stage of fabrication and FIG. 2 is a cross-sectional view taken along the lines 2-2 of FIG. 1. The semiconductor structure 100 includes a substrate or wafer 102 and a nanosheet stack 104 formed on the substrate 102. The substrate 102 defines a longitudinal x-axis, a horizontal y-axis and a vertical z-axis. The substrate 102 may include an oxide layer (not specifically shown) upon which the nanosheet stack 104 is formed. In illustrative embodiments, a sacrificial layer 106 is formed on the substrate 102. The sacrificial layer 106 may be an active layer and comprise a silicon germanium layer with at least fifty percent (50%) of the composition containing germanium. Other germanium compositions are also envisioned. The material of the sacrificial layer 106 is selective to the other materials forming the nanosheet stack 104 for removal during one or more subsequent etching processes. The substrate 102 may include a silicon (Si) material or another dielectric material, such as silicon oxide or silicon nitride. In illustrative embodiments, the substrate 102 may have a thickness of about 500 to 1000 micrometers (μm). The substrate 102 may itself comprise multiple layers, although it is shown as a single layer in the figures, again for clarity and simplicity of illustration.

The nanosheet stack 104 is formed as an alternating series of stacked semiconductor material layers. In illustrative embodiments, the nanosheet stack 104 includes an alternating arrangement of p-type semiconductor region channel nanosheets 108 and n-type semiconductor region channel nanosheets 110 disposed on the sacrificial layer 106. The p-type semiconductor region channel nanosheets comprise silicon germanium (SiGe) having a germanium composition of twenty-five percent (25%). Other germanium concentrations are also envisioned as long as the germanium concentration differs from the sacrificial layer 106. The n-type semiconductor region channel nanosheets 110 comprise silicon (Si). In general, the alternating p-type semiconductor region channel nanosheets 108 and n-type semiconductor region channel nanosheets 110 should be made of semiconductor materials that may be selectively etched relative to one another. The thicknesses of the p-type semiconductor region channel nanosheets 108 and n-type semiconductor region channel nanosheets 110 may vary depending upon the particular application. In one illustrative embodiment, p-type semiconductor region channel nanosheets 108 of silicon germanium may have a thickness of about 5-30 nm, and the and n-type semiconductor region channel nanosheets of silicon may have a thickness of about 5-15 nm. Of course, all of the p-type semiconductor region channel nanosheets 108 need not have the same thickness, and all of the n-type semiconductor region channel nanosheets 110 need not have the same thickness, although such may be the case in some applications.

The alternating sequence of p-type semiconductor region channel nanosheets 108 and n-type semiconductor region channel nanosheets 110 are deposited or grown on the semiconductor substrate 102, more particularly, on the sacrificial layer 106. The p-type semiconductor region channel nanosheets 108 and the n-type semiconductor region channel nanosheets 110 may be formed by a CVD deposition process or epitaxially grown in an alternating fashion in accordance with conventional methodologies. For example, the alternating series of p-type semiconductor region channel nanosheets 108 comprising silicon germanium (SiGe) and n-type semiconductor region channel nanosheets 110 comprising silicon (Si) nanosheets may be formed by epitaxially growing one layer and then the next until the desired number and desired thicknesses of the p-type semiconductor region and n-type semiconductor region channel nanosheets 108, 110 are achieved. Epitaxial materials can be grown from gaseous or liquid precursors, and may be grown using vapor-phase epitaxy (VPE), molecular-beam epitaxy (MBE), liquid-phase epitaxy (LPE), or other suitable process. Epitaxial silicon (Si), silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. In illustrative embodiments, p-type dopants are added to produce a p-type semiconductor region or transistor structure and n-type dopants are added to produce a n-type semiconductor region or transistor structure.

A hardmask layer 112 may be formed on top of the nanosheet stack 104. The hardmask layer 112 may be formed of any suitable material, e.g., a silicon nitride (SiN) hardmask material, that has an etch resistance greater than that of the substrate 102 and at least some of the insulator materials used in the remainder of the processing of the semiconductor structure 100. The material of hardmask layer 112 is used to cover/protect the nanosheet stack 104 during subsequent etching processes.

Figure 4:
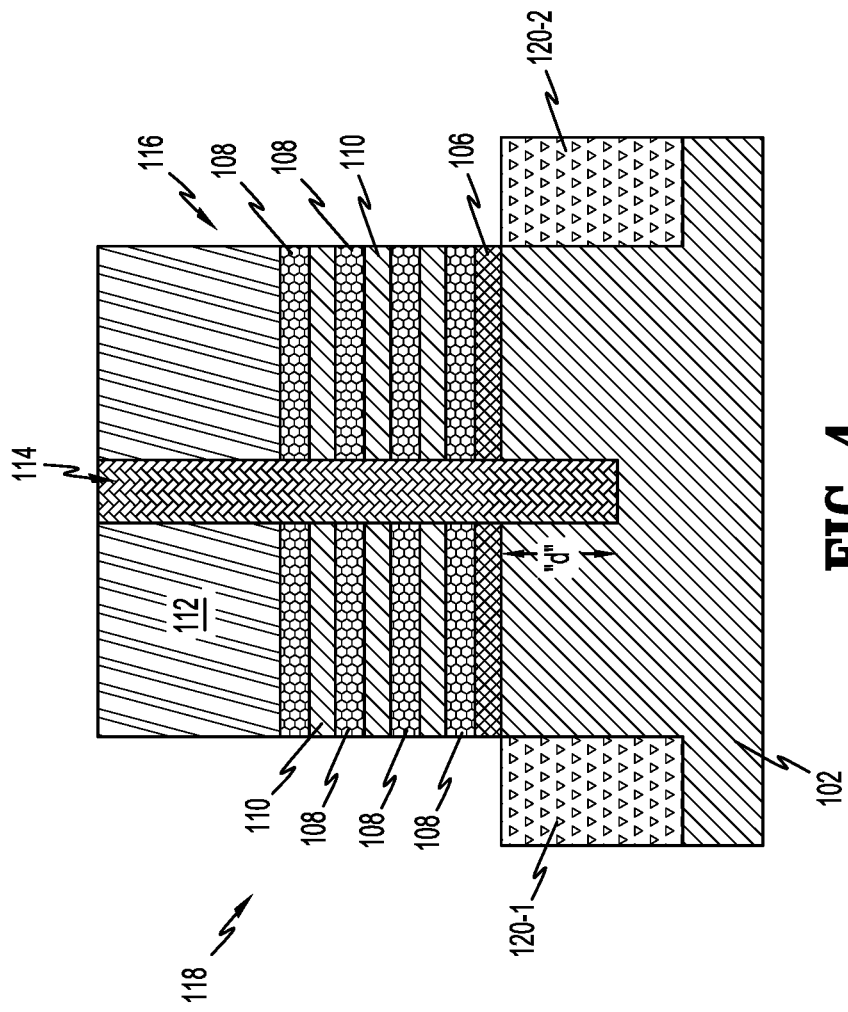
FIG. 4 is a cross-sectional view of the semiconductor structure at the second intermediate stage taken along the lines 4-4 of FIG. 3.
Figure 3:
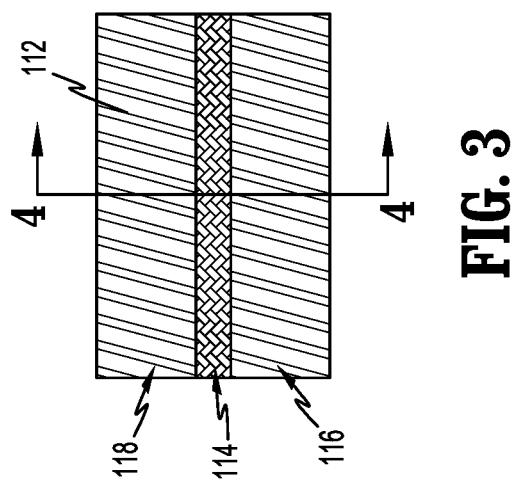
FIG. 3 is a top plan view of the semiconductor structure at a second intermediate stage of fabrication.

With reference now to FIGS. 3 and 4, representing an illustrative second intermediate stage of fabrication, via conventional lithographic and anisotropic etching processes, a vertical isolation channel is formed through the approximate center of the semiconductor structure 100 extending through the hardmask layer 112, the nanosheet stack 104 and into the interior of the semiconductor substrate 102 for a predetermined distance. The vertical isolation channel is filled with a dielectric material, including but not limited to, silicon nitride (SiN), silicon carbide (SiC), silicon oxynitride (SiON), carbon-doped silicon oxide (SiOC), silicon-carbonnitride (SiCN), boron nitride (BN), silicon boron nitride (SiBN), silicoboron carbonitride (SiBCN), silicon oxycabonitride (SiOCN), silicon oxide, and combinations thereof, to form a vertical dielectric isolation pillar 114 separating the nanosheet stack 104, and isolating a p-type semiconductor region and an n-type semiconductor region, represented by respective reference numerals 116, 118, of the semiconductor structure 100. The vertical dielectric isolation pillar 114 extends into the interior of the semiconductor substrate 102 a predetermined distance "d" where "d" is >0, such as, without limitation, for example, "d" ranging from about 10-30nm. As shown in FIG. 4, the ends of the p-type semiconductor region and n-type semiconductor region channel nanosheets 108, 110 may, in illustrative embodiments, contact the vertical dielectric isolation pillar 114. The vertical dielectric isolation pillar 114 will serve as an anchor to hold nanosheets stable in later processing, for example, in connection with the processes shown in FIGS. 4 and 5.

In addition, shallow trench isolation (STI) regions 120-1, 120-2 are formed at least partially within the substrate 102 on each lateral side of the nanosheet stack 104. The shallow trench isolation (STI) regions 120-1, 120-2 electrically isolate longitudinally spaced semiconductor structures 100. In one illustrative embodiment, the STI regions 120-1, 120-2 may be formed in conjunction with the aforementioned lithographic and anisotropic etching processes or subsequent processes to form respective trenches in the substrate 102. The formed trenches are filled with an isolation or STI dielectric fill including, for example, a dielectric material such as silicon oxide with a silicon nitride liner to form STI (shallow trench isolation) regions 120-1, 120-2. The STI regions 120-1, 120-2 may be subjected to a chemical mechanical polishing (CMP) process to planarize the dielectric fill of the STI regions 120-1, 120-2 to be coplanar with the top of the semiconductor substrate 102.

Figure 5:
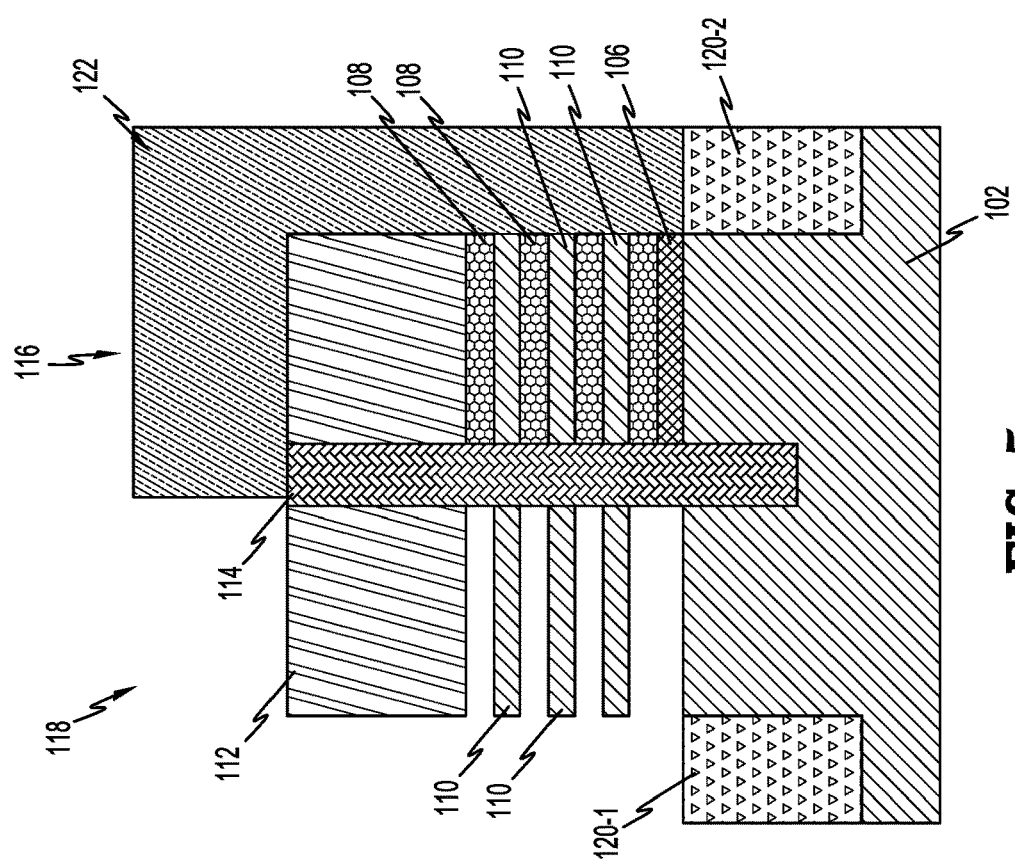
FIG. 5 is a cross-sectional view of the semiconductor structure at a third intermediate stage of fabrication.

Referring now to FIG. 5, representing an illustrative third intermediate stage of fabrication, a lithographic mask, represented by reference numeral 122, is deposited on the p-type semiconductor region 116 to encompass the vertical dielectric isolation pillar 114 and the STI region 120-2 adjacent the p-type semiconductor region 116. Through one or more etching processes selective to the silicon (Si) material of the n-type semiconductor region channel nanosheets 110, the portions of the p-type semiconductor region channel nanosheets 108, comprising the silicon germanium (SiGe) within the n-type semiconductor region 118 are removed, thereby leaving the n-type semiconductor region channel nanosheets 110 in suspended relation forming a suspended channel structure within the n-type semiconductor region 118. By "suspended channel" it is meant that the n-type semiconductor region channel nanosheets 110 are present overlying the substrate 102 in spaced relation. In illustrative embodiments, the ends of the n-type semiconductor region channel nanosheets 110 may be supported by, e.g., anchored, or coupled to, the vertical dielectric isolation pillar 114. Also removed by the one or more etching processes is the sacrificial layer 106. Removal of the sacrificial layer 106 creates a large void or gap (relative to the voids between the remaining vertically adjacent n-type semiconductor region channel nanosheets 110) between the lowermost silicon n-type semiconductor region channel nanosheet 110 and the silicon substrate 102. The lithographic mask 122 on the p-type semiconductor region 116 is thereafter removed by conventional processes.

Figure 6:
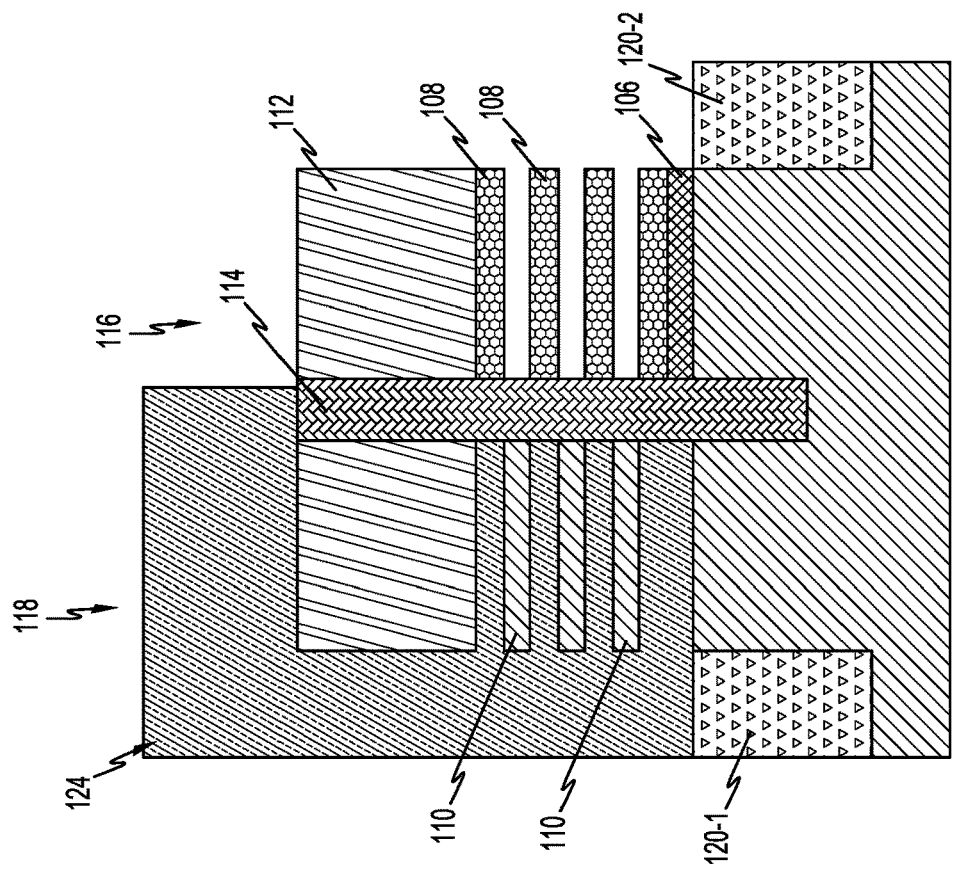
FIG. 6 is a cross-sectional view of the semiconductor structure at a fourth intermediate stage of fabrication.

Referring now to FIG. 6, representing an illustrative fourth intermediate stage of fabrication, the process is continued by deposition of a lithographic mask 124 on the n-type semiconductor region 118 to encompass the n-type semiconductor region 118, the vertical dielectric isolation pillar 114 and the STI region 120-1 adjacent the n-type semiconductor region 118. Through conventional etching processes selective to the material of the silicon germanium (SiGe) of the p-type semiconductor region channel nanosheets 108, the portions of the n-type semiconductor region channel nanosheets 110 comprising the silicon (Si) material are removed within the p-type semiconductor region 116 leaving the four p-type semiconductor region channel nanosheets 108 in a suspended manner relative to the semiconductor substrate 102. In illustrative embodiments, the ends of the p-type semiconductor region channel nanosheets 108 may be supported by, e.g., anchored, or coupled to, the vertical dielectric isolation pillar 114. The sacrificial layer 106 fabricated from the silicon germanium (SiGe 50%) also remains, and is not removed during any of the etching processes. More specifically, the chosen etching processes are also selective to the silicon germanium (SiGe 50%). The lithographic mask 124 on the n-type semiconductor region 118 is thereafter removed by conventional processes.

Figure 7:
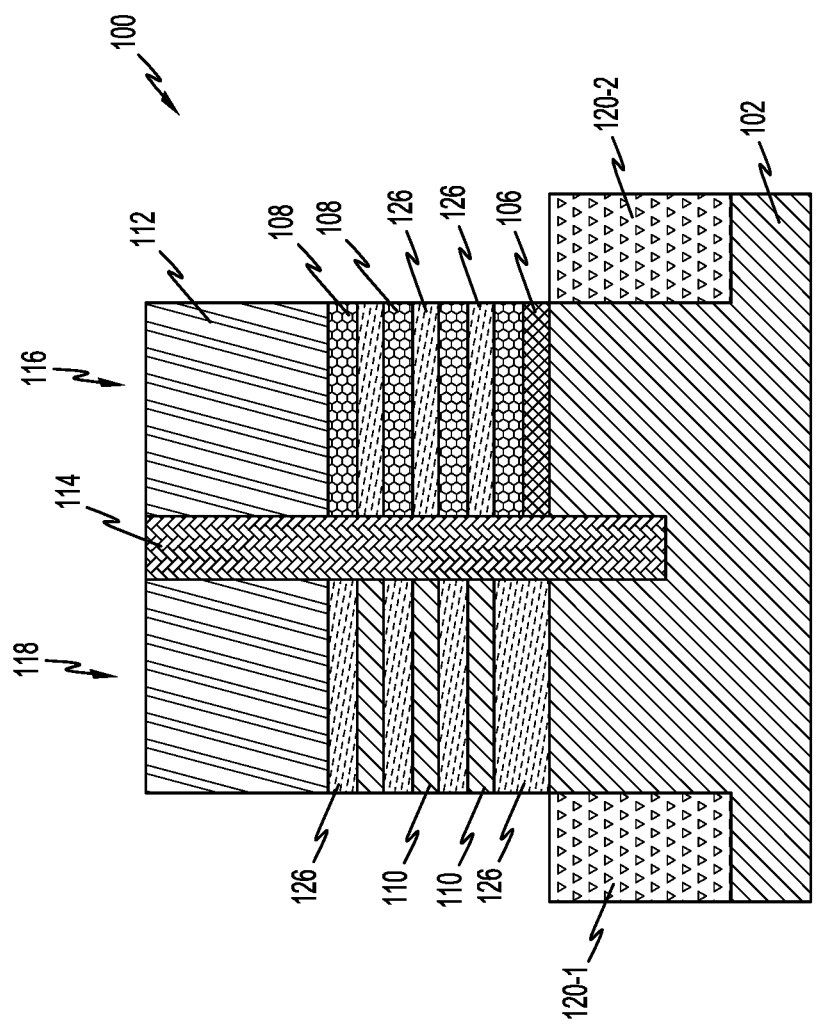
FIG. 7 is a cross-sectional view of the semiconductor structure at a fifth intermediate stage of fabrication.
Figure 8:
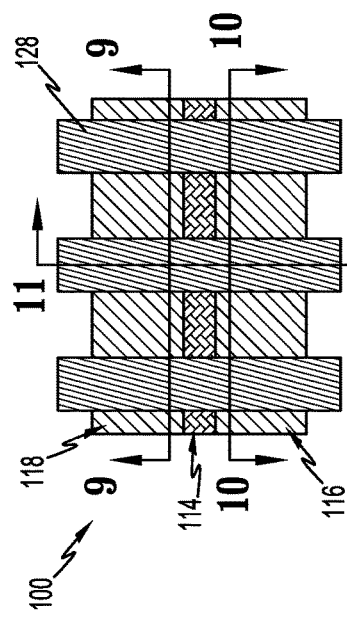
FIG. 8 is a top plan view of the semiconductor structure at a sixth intermediate stage of fabrication.
Figure 9:
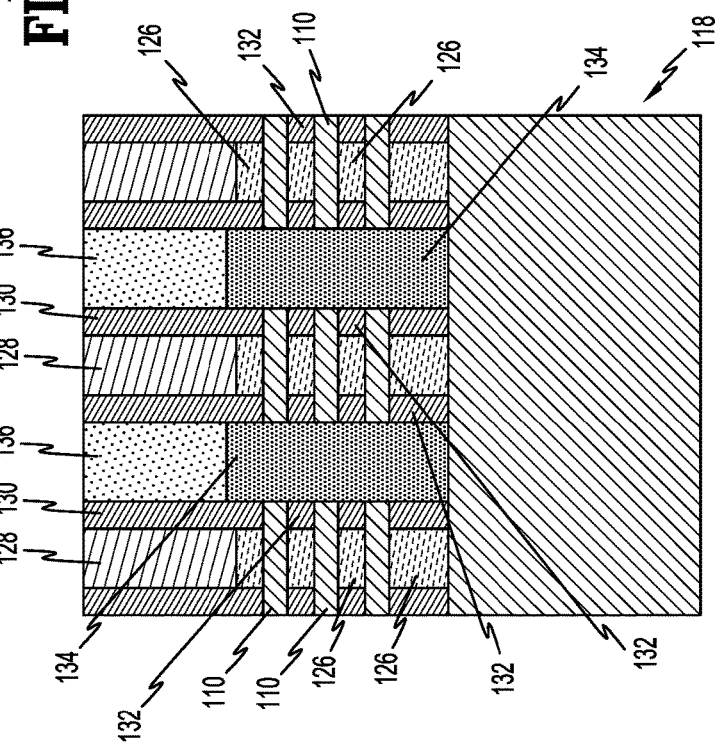
FIG. 9 is a cross-sectional view of the semiconductor structure at the sixth intermediate stage taken along the lines 9-9 of FIG. 8.
Figure 10:
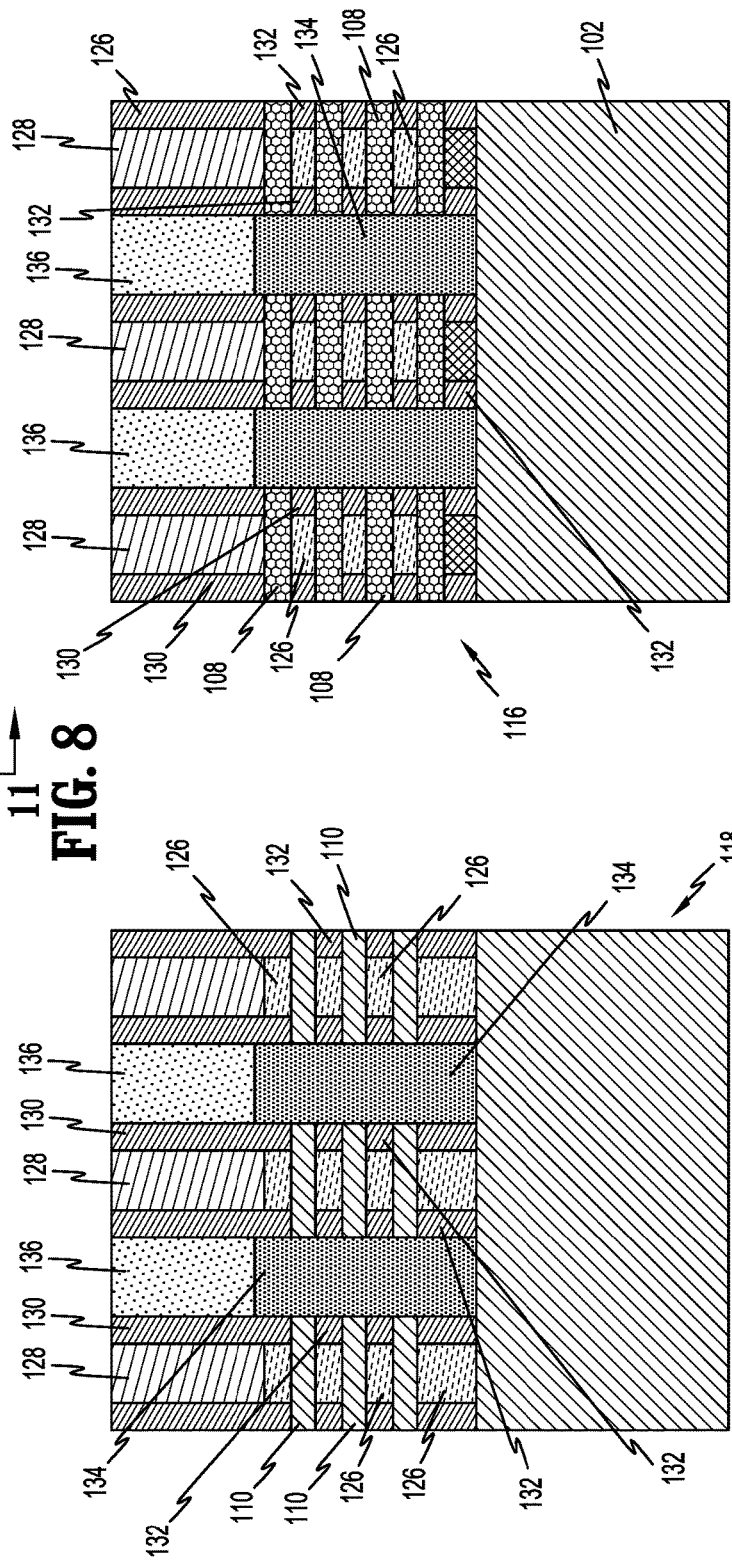
FIG. 10 is a cross-sectional view of the semiconductor structure at the sixth intermediate stage taken along the lines 10-10 of FIG. 8.
Figure 11:
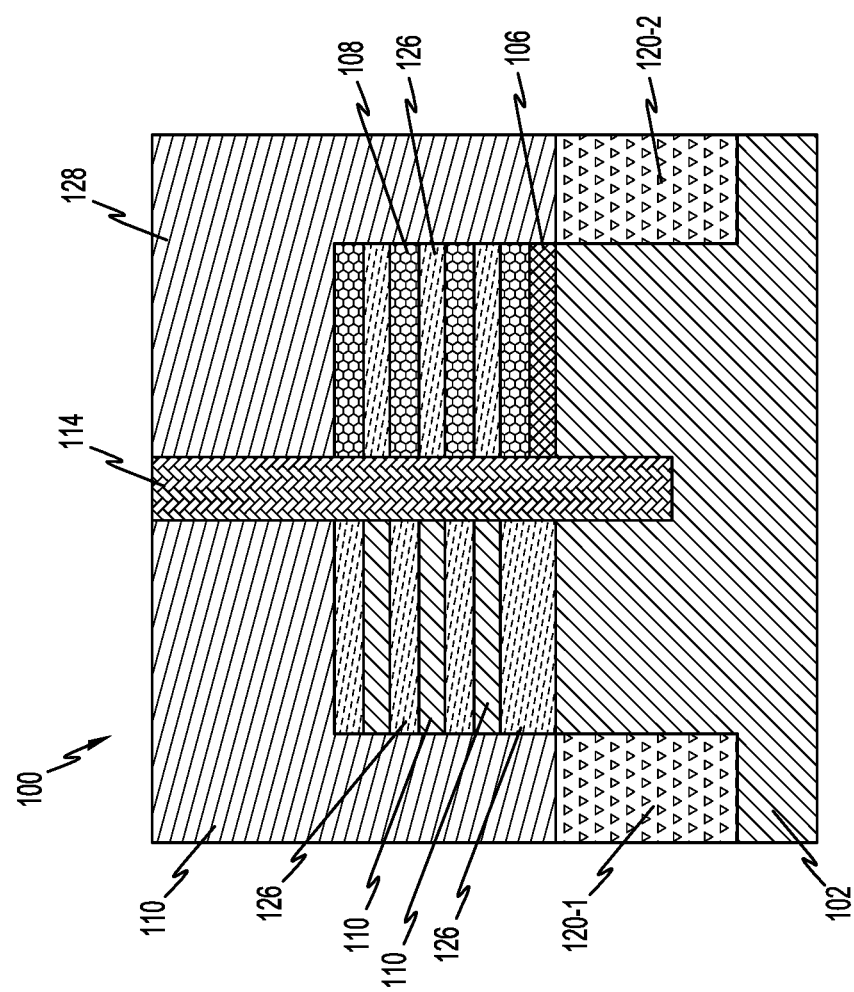
FIG. 11 is a cross-sectional view of the semiconductor structure at the sixth intermediate stage taken along the lines 11-11 of FIG. 8.
Figure 15:
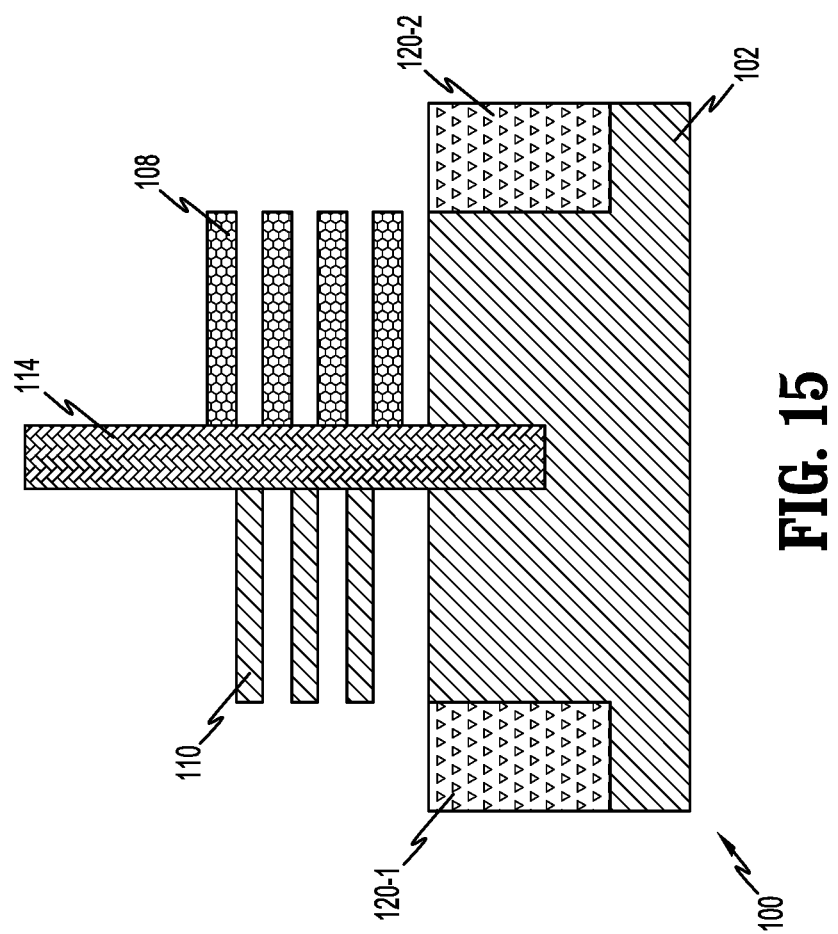
FIG. 15 is a cross-sectional view of the semiconductor structure at the seventh intermediate stage taken along the lines 15-15 of FIG. 12.
Figure 19:
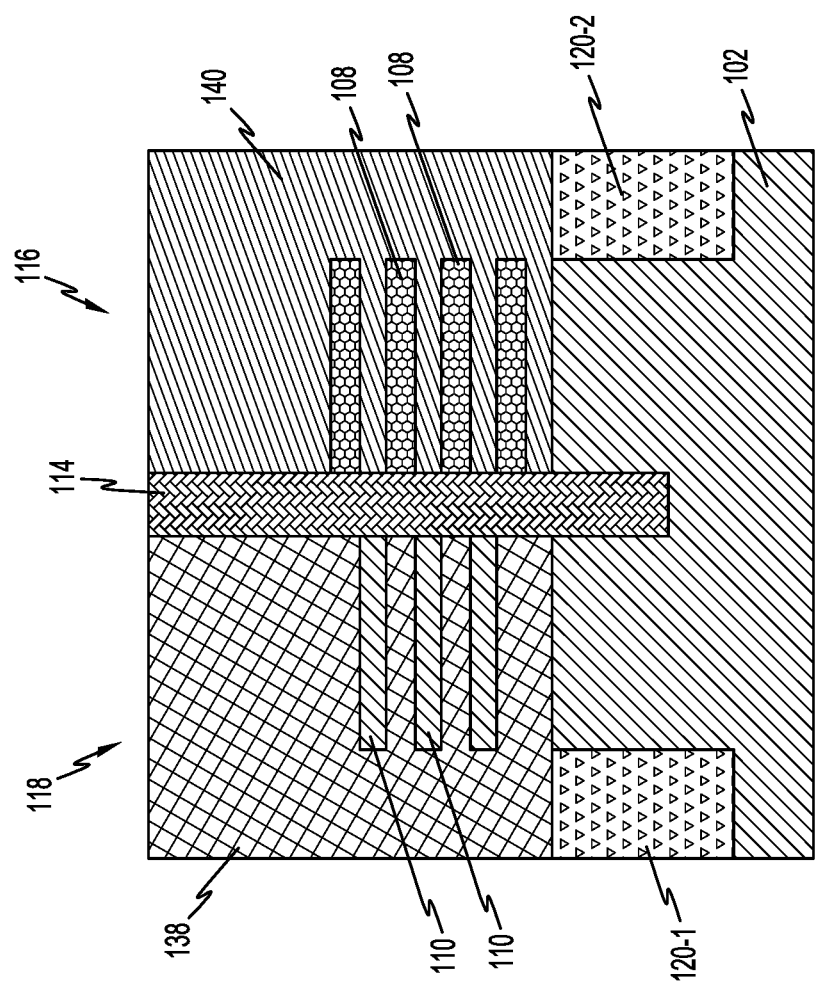
FIG. 19 is a cross-sectional view of the semiconductor structure at the eighth intermediate stage taken along the lines 19-19 of FIG. 16.

Referring now to FIG. 7, representing an illustrative fifth intermediate stage of fabrication, the semiconductor structure 100 is subjected to a deposition process whereby a sacrificial material including, but not limited to silicon germanium (SiGe) (containing, for example, 50% germanium), is deposited on the semiconductor structure 100 to fill the spaces or voids formed via the removal of the portions of the p-type semiconductor region channel nanosheets 108 in the n-type semiconductor region 118 and removal of the portions of the n-type semiconductor region channel nanosheets 110 in the p-type semiconductor region 116. The sacrificial material forms sacrificial layers 126 between vertically adjacent p-type semiconductor region channel nanosheets 108 and between vertically adjacent n-type semiconductor region channel nanosheets 110. The additional sacrificial material or sacrificial layers 126 are intended to protect the remaining p-type semiconductor region channel nanosheets 108 and n-type semiconductor region channel nanosheets 110 during subsequent manufacturing processes. Other materials including other silicon germanium materials with different germanium concentrations may be utilized as the sacrificial material. An optional silicon dioxide (SiO2) may also be used in conjunction with the sacrificial material.

Referring now to FIGS. 8-11, representing an illustrative sixth intermediate stage of fabrication, through one or more conventional lithographic and etching processes, one or more sacrificial gates 128 are formed on the nanosheet stack 104 arranged in orthogonal relation to the vertical dielectric isolation pillar 114. In one illustrative embodiment, three sacrificial gates 128 are formed on the nanosheet stack 104 although more or less than three sacrificial gates 128 are envisioned. The one or more sacrificial gates 128 serve as placeholders that are subsequently removed and replaced with suitable gate materials to form a functional gate structure. The sacrificial gates 128 may comprise any material that can be etched selectively to the materials of the p-type semiconductor region channel nanosheets 108 and the n-type semiconductor region channel nanosheets 110. One suitable material for the sacrificial gates 128 includes a silicon material, such as polysilicon, amorphous silicon, or any dielectric material such as an oxide, nitride or oxynitride material. The sacrificial gates 128 may be formed using deposition (e.g., chemical vapor deposition), planarization (e.g., chemical mechanical polish (CMP)), photolithography and etching processes (e.g., reactive ion etching). A hardmask layer (not specifically shown but incorporated as part of the structure of the sacrificial gate 128) may be formed on top of the sacrificial gates 128. The hardmask layer may be formed of any suitable material, e.g., a silicon nitride (SiN) hardmask material, that has an etch resistance greater than that of the substrate 102 and at least some of the insulator materials used in the remainder of the processing of the semiconductor structure 100. The hardmask material is used to cover/protect the nanosheet stack 104 during subsequent etching processes. The hardmask layer 112 disposed on the nanosheet stack 104 is removed during these processes.

A gate spacer 130 is also formed around each sacrificial gate 128 (and around the hardmask layer). The gate spacer 130 may comprise a dielectric material, such as silicon boron carbide nitride (SiBCN), silicon oxycabonitride (SiOCN), carbon-doped silicon oxide (SiOC), silicon-carbon-nitride (SiCN), boron nitride (BN), silicon boron nitride (SiBN), an oxide, nitride, silicon nitride (SiN), silicon oxide (SO₂) or other materials including low-k materials. In illustrative embodiments, the gate spacer 130 comprises SiBCN. The gate spacer 130 may be formed using a deposition process, such as chemical vapor deposition (CVD), and a reactive-ion etching (RIE) process. The gate spacers 130 are disposed on the sidewalls of the sacrificial gate 128, and may have a wall thickness ranging from about 3 nanometers (nm) to about 15 nanometers (nm).

With continued reference to FIGS. 8-11, inner spacers 132 are formed in each nanosheet stack 104 in alignment with the gate spacers 130. In illustrative embodiments, in conjunction with one or more lithographic processes, one or more etching processes selective to the material of the silicon germanium (SiGe 25%) of the p-type semiconductor region channel nanosheets 108 and the silicon (Si) of the n-type semiconductor region nanosheet channels 110 are utilized to recess peripheral or end portions of the sacrificial material or sacrificial layers 126. One suitable etching process includes an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (ME). Other examples of anisotropic etching that can be used at this point of the present disclosure include ion beam etching, plasma etching or laser ablation.

Thereafter, the voids created by the removed portions of sacrificial layers 126 are filled via one or more deposition processes with material of the inner spacer 132. The material of the inner spacer 132 may include any of the materials identified hereinabove with the gate spacer 130. In illustrative embodiments, the gate spacers 130 and the inner spacers 132 may be formed simultaneously utilizing the same etching and deposition processes. In other illustrative embodiments, the gate spacers 130 and the inner spacers 132 may be formed in separate processes.

In illustrative embodiments, forming the sacrificial gates 128, the gate spacers 130 and the inner spacers 132 may also include recessing peripheral portions of the p-type semiconductor region channel nanosheets 108 and the n-type semiconductor region channel nanosheets 110 that extend beyond the outer sidewall of the sacrificial gates 128. In illustrative embodiments, the etch process for removing the portion of the nanosheet stack 104 that extends beyond the outer sidewall of the gate spacer 130 may be a selective etch process. For example, in one embodiment, a selective etch may include an etch chemistry that removes a first material selective to a second material by a ratio of 10:1 or greater, e.g., 1000:1. For example, one or more etch processes may remove the exposed silicon germanium (SiGe) material of the p-type semiconductor region channel nanosheets 108 and the exposed silicon (Si) material of the n-type semiconductor region channel nanosheets 110, selectively to at least one of the materials of the sacrificial gates 128, the gate spacers 130, the inner spacers 132 and the substrate 102. In some embodiments, an etch block mask, such as a photoresist or hardmask, e.g., silicon nitride (SiN) mask, may be formed over the sacrificial gate 128 during the etch process for removing the exposed portions of the nanosheet stack 104.

With continued reference to FIGS. 8-11, the process is continued by forming source and drain (S/D) regions 134 about each sacrificial gate 128 between adjacent inner spacers 132. The S/D regions 134 are formed using an epitaxial layer growth process. In illustrative embodiments, formation of the S/D regions 134 in the p-type semiconductor region 116 comprises epitaxial growth of silicon germanium (SiGe) material which may be similar to the material of the p-type semiconductor region channel nanosheets 108 and formation of the S/D regions 134 in the n-type semiconductor region 118 comprises epitaxial growth of silicon (Si) material which may be similar to the material of the n-type semiconductor region channel nanosheets 110. As used herein, the term "drain" means a doped region in the semiconductor structure located at the end of the channel region, in which carriers are flowing out of the semiconductor structure 100, e.g., nanosheet transistor structure, through the drain. The term "source" is a doped region in the semiconductor structure, in which majority carriers are flowing into the channel region. The S/D regions 134 may be formed by in-situ doping (doping during epitaxy) or ex-situ doping, or a combination of in-situ doping and ex-situ doping. Doping techniques may include but, are not limited to, ion implantation, gas phase doping, plasma doping, plasma immersion ion implantation, cluster doping, infusion doping, liquid phase doping, solid phase doping, and/or any suitable combination of those techniques. In some embodiments, dopants are activated by thermal annealing such as laser annealing, flash annealing, rapid thermal annealing (RTA) or any suitable combination of those techniques.

Epitaxial growth or deposition of the S/D regions 134 may be carried out in a chemical vapor deposition apparatus, such as a metal organic chemical vapor deposition (MOCVD) apparatus or a plasma enhanced chemical vapor deposition (PECVD) apparatus. The epitaxial semiconductor S/D regions 134 may be in situ doped to a p-type or n-type conductivity. The term "in-situ" denotes that a dopant, e.g., p-type or n-type dopant, is introduced to the base semiconductor material, e.g., silicon (Si) or silicon germanium (SiGe), during the formation of the base material. In one illustrative embodiment, for a p-type conductivity, boron p-type dopants are introduced into the epitaxial growth of silicon germanium (SiGe) and, for an n-type conductivity, phosphorous n-type dopants are introduced into the epitaxial growth of silicon (Si).

An inter-layer dielectric (ILD) 136 is deposited on the semiconductor structure 100 to at least partially encompass the nanosheet stack 104 and the sacrificial gates 128. In illustrative embodiments, the inter-layer dielectric (ILD) 136 is an oxide layer. In various embodiments, a height of the inter-layer dielectric (ILD) 136 can be reduced by chemical-mechanical polishing (CMP) and/or etching to expose the sacrificial gates 128. Other suitable dielectric materials for forming the inter-layer dielectric (ILD) 136 include but are not limited to, silicon oxide, silicon nitride, silicon oxynitride, SiCO, SiCON, or any suitable combination of such materials.

Referring now to FIGS. 12-15, representing an illustrative seventh intermediate stage of fabrication, the sacrificial gates 128 are removed. In illustrative embodiments, removal of the sacrificial gates 128 may be effected using one or more wet or dry etch processes. More specifically, the sacrificial gates 128 may be removed by at least one of an anisotropic etch process, such as reactive ion etch (RIE), or an isotropic etch process, such as a wet chemical etch, or a combination of both. In one example, the etch process for removing the sacrificial gates 128 can include an etch chemistry for removing the sacrificial gates 128 selective to the material layers of the silicon germanium (SiGe) of the p-type semiconductor region channel nanosheets 108 and the silicon (Si) of the n-type semiconductor region channel nanosheets 110. Upon removal of the sacrificial gates 128, an opening or replacement gate cavity exposing each of the underlying suspended channels of p-type semiconductor region channel nanosheets 108 and n-type semiconductor region channel nanosheets 110 is formed.

Following removal of the sacrificial gates 128, the sacrificial layers 126 and the remaining portion of the sacrificial layer 106 in the p-type semiconductor region 116 is removed via one or more etching processes selective to the silicon germanium (SiGe) of the p-type semiconductor region channel nanosheets 108 and the silicon of the n-type semiconductor region channel nanosheets 110. Subsequent to removal of the sacrificial layers 106, 126, a suspended channel structure is formed in each of the p-type semiconductor region and n-type semiconductor region 116, 118. By "suspended channel" it is meant that the p-type semiconductor region channel nanosheets 108 and the n-type semiconductor region channel nanosheets 110 are present overlying the substrate 102, and supported, coupled or anchored to the inner spacers 132 in spaced relation. As noted hereinabove, the p-type semiconductor region channel nanosheets 108 and the n-type semiconductor region channel nanosheets 110 also contact, engage and/or are partially embedded in, the vertical dielectric isolation pillar 114. Gate structure materials, electrically conductive materials and/or semiconductor materials may be formed in the space surrounding the suspended structures.

Referring now to FIG. 16-19, representing an illustrative eighth intermediate stage of fabrication, the process is continued by forming replacement high-k/metal gate structures 138 around the n-type semiconductor region channel nanosheets 110 within the n-type semiconductor region 118 and replacement high-k/metal gate structures 140 around the p-type semiconductor region channel nanosheets 108 within the p-type semiconductor region 116. For example, a conformal high-k gate liner and a work function metal may be deposited onto the semiconductor structure 100. The gate liner can be formed on the entirety of the exterior surface of the suspended p-type semiconductor region channel nanosheets 108 and n-type semiconductor region channel nanosheets 110. Examples of gate dielectric materials include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also envisioned.

The work function metal may be deposited onto the semiconductor structure 100, i.e., within or over the high-k liner to form a functional gate structure. The work function metal may be formed by depositing a conductive material including, but not limited to titanium nitride (TiN), titanium aluminum nitride (TiAlN) and/or combinations thereof. Other suitable materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. In embodiments, the work function metal includes one or more of TiN, TiAlC or combinations thereof. The first work function metal may further comprise dopants that are incorporated during or after deposition. The work function metal is deposited using a suitable deposition process, e.g., CVD, plasma-enhanced chemical vapor deposition (PECVD), PVD, plating, thermal or e-beam evaporation, sputtering, etc. In illustrative embodiments, the p-type semiconductor region includes gate structures of a first material and the n-type semiconductor regions include gate structures of a second material different from the first material including, without limitation, TiAlC for the n-type semiconductor region and TiN for the p-type semiconductor region.

Thus, the above processes provide a semiconductor structure 100 with at least the following features. The semiconductor substrate 100, in illustrative embodiments, is a forksheet device with a central vertical dielectric isolation pillar 114 separating a p-type semiconductor region 116 and an n-type semiconductor region 118. The semiconductor structure may include one or more gates including, without limitation multiple gates such as three (3) gates over the substrate 102 and spanning the p-type semiconductor region or device 116 and the n-type semiconductor region or device 118. The p-type semiconductor region 116 includes a first number of p-type semiconductor region channel nanosheets 108 on a first lateral side of the vertical dielectric isolation pillar 114, which may be in contact or coupled to the first lateral side of the vertical dielectric isolation pillar 114. The p-type semiconductor region channel nanosheets 108 may be fabricated from silicon germanium (SiGe), and surrounded by a gate structure of a first material. The silicon germanium material provides excellent hole mobility. The n-type semiconductor region 118 includes a second number of n-type semiconductor region channel nanosheets 110 on a second lateral side of the vertical dielectric isolation pillar 114, which may be in contact or coupled to the second lateral side of the vertical dielectric isolation pillar 114. The n-type semiconductor region channel nanosheets 110 may be fabricated from silicon (Si), and surrounded by a gate structure of a second material, which, in illustrative embodiments, is different from the first material. Silicon (Si) is a good conductor and provides a high mobility of electrons. The first number of p-type semiconductor region channel nanosheets 108 and the second number of n-type semiconductor region channel nanosheets 110 may or may not be the same. In illustrative embodiments, the first and second numbers are different. In further illustrative embodiments, the first number of p-type semiconductor region channel nanosheets 108 is greater than the second number of n-type semiconductor region channel nanosheets 110. The thickness of the p-type semiconductor region channel nanosheets 108 and the n-type semiconductor region channel nanosheets 110 may or may not be the same. In other illustrative embodiments, the p-type semiconductor region channel nanosheets 108 are offset vertically along the z-axis relative to the n-type semiconductor region channel nanosheets 110 in a staggered or alternating arrangement. In other illustrative embodiments, the p-type semiconductor region channel nanosheets 108 and the n-type semiconductor region channel nanosheets 110 are vertically aligned.

In illustrative embodiments, the suspended p-type semiconductor region channel nanosheets 108 and the n-type semiconductor region channel nanosheets 110 may be further processed to provide a nanowire geometry. The term "nanosheet" denotes a substantially two-dimensional structure with thickness in a scale ranging from 1 to 100 nm. The width and length dimensions of the nanosheet may be greater than the width dimensions. As used herein, the term "nanowire" describes a structure having a cross-section with a perimeter defined by a curvature, wherein a diameter of the cross-section is less than 1 micron. A nanowire may have an aspect ratio, e.g., height to width ratio, that is approximately 1. In some examples, the cross-section of the nanowire may have a diameter ranging from 1 nm to 40 nm. A nanowire geometry can be produced from the suspended p-type semiconductor region channel nanosheets 108 and the n-type semiconductor region channel nanosheets 110 using etch processing, such as isotropic etch processing.

Semiconductor devices and methods for forming same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of illustrative embodiments.

Accordingly, at least portions of one or more of the semiconductor structures described herein may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In some embodiments, the suspended nanosheets channel structures may be further processed to provide nanowires. For example, a nanowire geometry can be produced from the suspended channel structures using etch processing, such as isotropic etch processing. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a first device disposed on a substrate, the first device comprising a first plurality of nanosheets, wherein the first plurality of nanosheets comprises a p-type material;
   a second device disposed on the substrate, the second device comprising a second plurality of nanosheets, wherein the second plurality of nanosheets comprises an n-type material;
   a dielectric isolation pillar extending vertically from within a top surface of the substrate and disposed between the first device and the second device;
   a first shallow trench isolation region disposed at least partially within the substrate on a first lateral side of the first plurality of nanosheets; and
   a second shallow trench isolation region disposed at least partially within the substrate on a first lateral side of the second plurality of nanosheets;
   wherein a second lateral side of the first plurality of nanosheets extends from a first lateral side of the dielectric isolation pillar and a second lateral side of the second plurality of nanosheets extends from a second lateral side of the dielectric isolation pillar;
   wherein each of the first plurality of nanosheets are in a staggered arrangement relative to each of the second plurality of nanosheets; and
   wherein the first plurality of nanosheets and the second plurality of nanosheets are each of a uniform width.

2. The semiconductor structure according to claim 1 wherein the first plurality of nanosheets and the second plurality of nanosheets are in contact with the dielectric isolation pillar.

3. The semiconductor structure according to claim 1 wherein the p-type material comprises silicon germanium and wherein the n-type material comprise silicon.

4. The semiconductor structure according to claim 1 wherein the first device comprises a first given number of the first plurality of nanosheets and the second device comprises a second given number of the second plurality of nanosheets, wherein the first given number is different than the second given number.

5. The semiconductor structure according to claim 4 wherein the first given number of the first plurality of nanosheets is greater than the second given number of the second plurality of nanosheets.

6. The semiconductor structure according to claim 5 wherein the first plurality of nanosheets is vertical offset relative to the second plurality of nanosheets.

7. The semiconductor structure according to claim 1 wherein:
   the first device includes one or more gate structures each having a first work function metal, and source and drain regions; and
   the second device includes one or more gate structures each having a second work function metal, and source and drain regions.

8. The semiconductor structure according to claim 7 wherein the second work function metal is different from the first work function metal.

9. The semiconductor structure according to claim 1 including at least three gates disposed on the substrate.

10. The semiconductor structure according to claim 1 wherein the dielectric isolation pillar extends into the substrate a predetermined distance.

11. A semiconductor structure comprising:
- a dielectric isolation pillar extending vertically from within a top surface of a substrate;
- a pFET device comprising a first plurality of channel nanosheets disposed on a first lateral side of the dielectric isolation pillar and in contacting relation therewith;
- an nFET device comprising a second plurality of channel nanosheets disposed on a second lateral side of the dielectric isolation pillar and in contacting relation therewith;
- a first shallow trench isolation region disposed at least partially within the substrate on a first lateral side of the pFET device; and
- a second shallow trench isolation region disposed at least partially within the substrate on a first lateral side of the nFET device;
- wherein a second lateral side of the pFET device extends from the first lateral side of the dielectric isolation pillar and a second lateral side of the nFET device extends from the second lateral side of the dielectric isolation pillar;
- wherein each of the first plurality of channel nanosheets are in a staggered arrangement relative to each of the second plurality of channel nanosheets; and
- wherein the first plurality of channel nanosheets and the second plurality of channel nanosheets are each of a uniform width.

12. The semiconductor structure according to claim 11 wherein the first plurality of channel nanosheets of the pFET device comprise a first material and the second plurality of channel nanosheets of the nFET device comprise a second material different from the first material.

13. The semiconductor structure according to claim 12 wherein the first material comprises silicon germanium and wherein the second material comprises silicon.

14. The semiconductor structure according to claim 11 wherein the pFET device includes a first number of channel nanosheets and the nFET device includes a second number of channel nanosheets different from the first number.

15. The semiconductor structure according to claim 14 wherein the first number of channel nanosheets of the pFET device is greater than the second number of channel nanosheets of the nFET device.

16. The semiconductor structure according to claim 11 wherein the channel nanosheets of the pFET device are vertically offset relative to the channel nanosheets of the nFET device.

17. A method, comprising:
- forming a first device on a semiconductor substrate, the first device comprising a first plurality of nanosheets, wherein the first plurality of nanosheets comprises a p-type material;
- forming a second device on the semiconductor substrate, the second device comprising a second plurality of nanosheets, wherein the second plurality of nanosheets comprises an n-type material;
- forming a dielectric isolation pillar extending vertically from within a top surface of the semiconductor substrate between the first device and the second device;
- forming a first shallow trench isolation region at least partially within the semiconductor substrate on a first lateral side of the first plurality of nanosheets; and
- forming a second shallow trench isolation region at least partially within the semiconductor substrate on a first lateral side of the second plurality of nanosheets;
- wherein a second lateral side of the first plurality of nanosheets extends from a first lateral side of the dielectric isolation pillar and a second lateral side of the second plurality of nanosheets extends from a second lateral side of the dielectric isolation pillar;
- wherein each of the first plurality of nanosheets are in a staggered arrangement relative to each of the second plurality of nanosheets; and
- wherein the first plurality of nanosheets and the second plurality of nanosheets are each of a uniform width.

18. The method according to claim 17, wherein the p-type material of the first plurality of nanosheets comprises silicon germanium and the n-type material of the second plurality of nanosheets comprises silicon.

19. The method according to claim 17 including contacting each of the first plurality of nanosheets and the second plurality of nanosheets with the dielectric isolation pillar.

20. The method according to claim 17 including arranging the first plurality of nanosheets in vertical offset relation relative to the second plurality of nanosheets.

* * * * *